(12) United States Patent
Cheng

(10) Patent No.: US 10,367,504 B1
(45) Date of Patent: Jul. 30, 2019

(54) LOW POWER NEGATIVE VOLTAGE LEVEL SHIFTER

(71) Applicant: NOVATEK Microelectronics Corp., Hsin-Chu (TW)

(72) Inventor: Yen-Cheng Cheng, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/116,877

(22) Filed: Aug. 29, 2018

(51) Int. Cl.
*H03K 19/00* (2006.01)
*H03K 19/0185* (2006.01)

(52) U.S. Cl.
CPC . *H03K 19/0013* (2013.01); *H03K 19/018521* (2013.01)

(58) Field of Classification Search
None
See application file for complete search history.

(56) References Cited

U.S. PATENT DOCUMENTS

| | | | |
|---|---|---|---|
| 2015/0145584 A1* | 5/2015 | Kim | H03K 19/017509 327/333 |
| 2015/0162912 A1* | 6/2015 | Lin | H03K 3/356182 327/333 |
| 2015/0381180 A1* | 12/2015 | Tsuji | H03K 19/018521 327/319 |

\* cited by examiner

*Primary Examiner* — Jany Richardson
(74) *Attorney, Agent, or Firm* — Winston Hsu

(57) ABSTRACT

A negative voltage level shifter includes a pair of input transistors, a pair of output transistors and a clamp circuit. The clamp circuit is coupled between the pair of input transistors and the pair of output transistors, for clamping source voltages of the pair of input transistors.

9 Claims, 10 Drawing Sheets

LOW POWER NEGATIVE VOLTAGE LEVEL SHIFTER

BACKGROUND OF THE INVENTION

1. Field of the Invention

The present invention relates to a negative voltage level shifter, and more particularly, to a negative voltage level shifter capable of converting a positive core voltage to a negative output voltage.

2. Description of the Prior Art

A mixed-mode integrated circuit (IC) includes digital circuits and analog circuits, which operate under different voltage levels. The digital circuits receive core supply voltage which may have a lower level, while the analog circuits receive a larger voltage level or a negative voltage level. For example, the digital circuits may operate by receiving 1.5V power supply voltage and 0V ground voltage. Most of the analog circuits operate in a positive voltage domain by receiving 6V power supply voltage and 0V ground voltage, and other analog circuits operate in a negative voltage domain by receiving -6V negative power supply voltage and 0V ground voltage. If a signal from a digital circuit is served to control the operation of an analog circuit operated in a negative voltage domain, a negative voltage level shifter is required to perform voltage conversion on the signal.

There are various implementations of a negative voltage level shifter that converts a positive core voltage to a negative analog voltage. FIG. 1 illustrates a block diagram of the negative voltage level shifter. In this example, a core voltage VCC, e.g., 1.5V, is converted to a target negative voltage NV, e.g., -6V. A core voltage domain between VCC and the ground voltage GND is first converted to a voltage domain between VCC and a negative voltage VCL, e.g., -3V. This voltage domain is further converted to a voltage domain between an analog ground voltage GNDA and the negative voltage VCL. Finally, the negative voltage VCL, -3V, is boosted to the target negative voltage NV. This implementation is realized with 3 level shifters or a level shifter having 3 circuit stages, and thus requires more circuit areas. Also, the power consumption of the level shifter is tripled due to the 3-step level shift operations.

Thus, there is a need to provide a novel negative voltage level shifter to solve the abovementioned problems.

SUMMARY OF THE INVENTION

It is therefore an objective of the present invention to provide a negative voltage level shifter implemented with one circuit stage and thus having less power consumption.

An embodiment of the present invention discloses a negative voltage level shifter, which comprises a pair of input transistors, a pair of output transistors and a clamp circuit. The clamp circuit is coupled between the pair of input transistors and the pair of output transistors, for clamping source voltages of the pair of input transistors.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
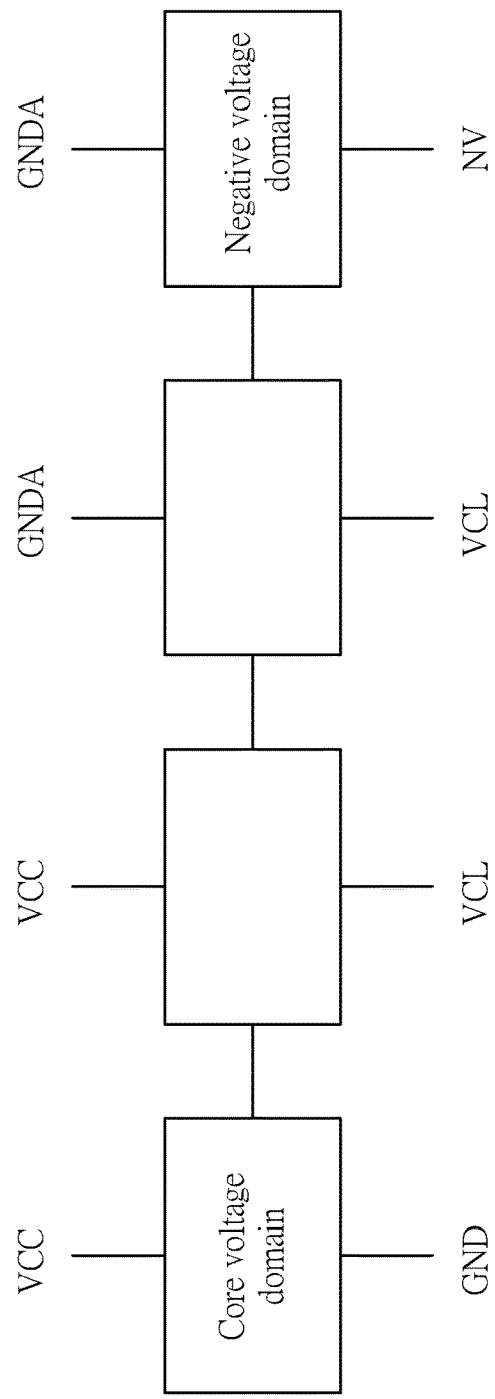
FIG. 1 illustrates a block diagram of the negative voltage level shifter.
Figure 2:
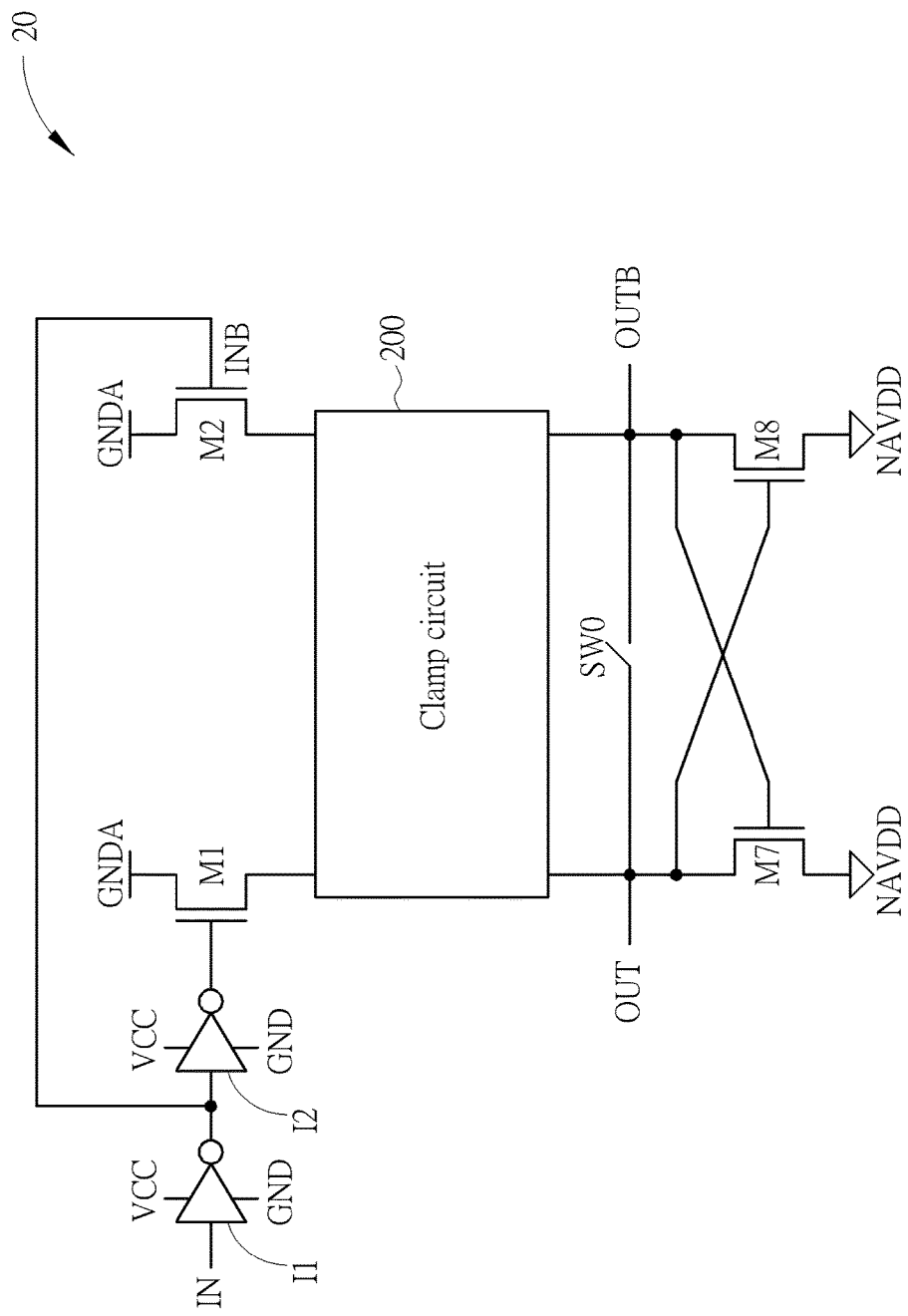
FIG. 2 is a schematic diagram of a negative voltage level shifter according to an embodiment of the present invention.
Figure 3:
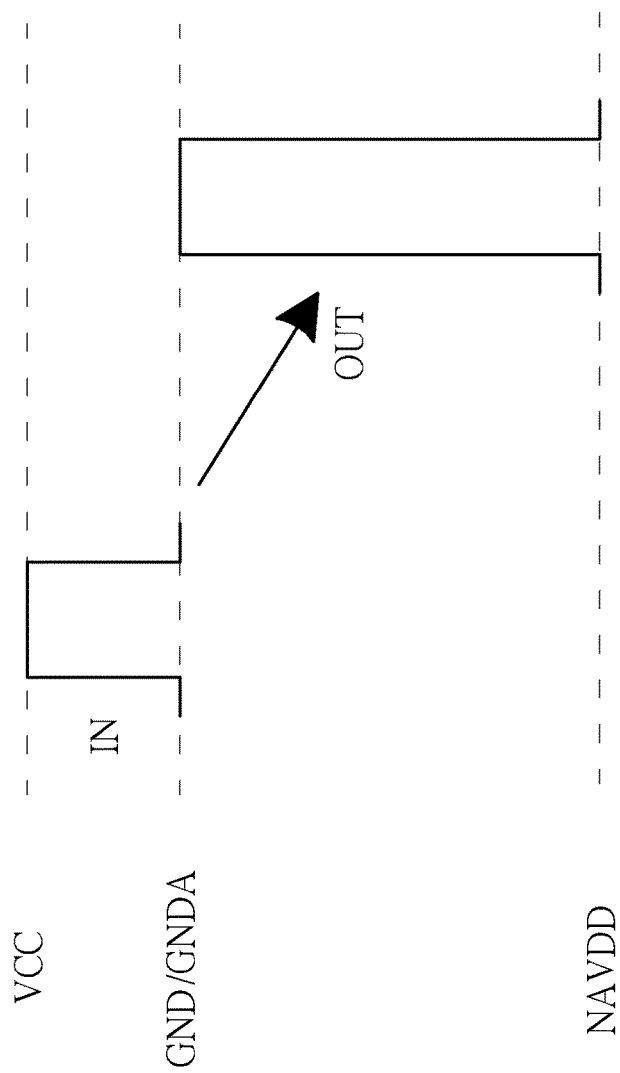
FIG. 3 is a waveform diagram of the voltage relations of the input signal and the output signal.

Please refer to FIG. 2, which is a schematic diagram of a negative voltage level shifter 20 according to an embodiment of the present invention. As shown in FIG. 2, the negative voltage level shifter 20 includes a pair of input transistors M1 and M2, a clamp circuit 200, a pair of output transistors M7 and M8, and a switch SW0. Two inverters I1 and I2, which may be or may not be included in the negative voltage level shifter 20, are also illustrated in FIG. 2. The negative voltage level shifter 20 receives an input signal IN and correspondingly outputs an output signal OUT and an inverse output signal OUTB. More specifically, the inverters I1 and I2 are operated in a positive voltage domain VCC-GND, and the negative voltage level shifter 20 converts the positive voltage domain VCC-GND to a negative voltage domain GNDA-NAVDD. In an example, the voltage VCC may be 1.5V as a core voltage, while the voltage NAVDD may be -6V as a negative supply voltage for a display driver. The voltages GND and GNDA are ground voltages. The waveforms of the input signal IN and the output signal OUT and their voltage relations are illustrated in FIG. 3.

The clamp circuit 200 is disposed between the pair of input transistors M1 and M2 and the pair of output transistors M7 and M8. The clamp circuit 200 may clamp the source voltages of the input transistors M1 and M2, to ensure one of the input transistors M1 and M2 to be turned off during state transition. With the implementation of the clamp circuit, whether to turn on or off the pair of input transistors M1 and M2 is determined by a bias voltage received by the clamp circuit; this allows the operations of the pair of input transistors M1 and M2 to be effectively controlled during state transition. The current consumption may be reduced due to the turned-off input transistor. Also, the state transition may be accomplished more easily if currents do not flow in both branches during the transition time. In this embodiment, the current flows in only one branch during the transition time.

In detail, the pair of input transistors M1 and M2 are NMOS transistors. As for the input transistor M1, the drain terminal is coupled to a ground terminal, e.g., an analog ground terminal, for receiving the ground voltage GNDA, the source terminal is coupled to the clamp circuit 200, and the gate terminal is coupled to an input terminal of the negative voltage level shifter 20 for receiving the input signal IN. As for the input transistor M2, the drain terminal is coupled to the ground terminal for receiving the ground voltage GNDA, the source terminal is coupled to the clamp circuit 200, and the gate terminal is coupled to another input terminal of the negative voltage level shifter 20 for receiving an inverse input terminal INB. The pair of output transistors M7 and M8 are NMOS transistors. As for the output transistor M7, the drain terminal is coupled to the clamp circuit 200, the source terminal is coupled to a negative power supply terminal of the negative voltage level shifter 20 for receiving the negative supply voltage NAVDD, and the gate terminal is coupled to the drain terminal of the output transistor M8. As for the output transistor M8, the drain terminal is coupled to the clamp circuit 200, the source terminal is coupled to the negative power supply terminal of the negative voltage level shifter 20 for receiving the negative supply voltage NAVDD, and the gate terminal is coupled to the drain terminal of the output transistor M7. The switch SW0 is coupled between the output terminal and the inverse output terminal of the negative voltage level shifter 20. In this embodiment, the output terminal is the drain terminal of the output transistor M7, and the inverse output terminal is the drain terminal of the output transistor M8. Those skilled in the art may understand that a level shifter may have one or two output terminals; that is, the negative voltage level shifter 20 may output one or both of the output signal OUT and the inverse output signal OUTB. This should not be a restriction on the present invention.

Figure 4:
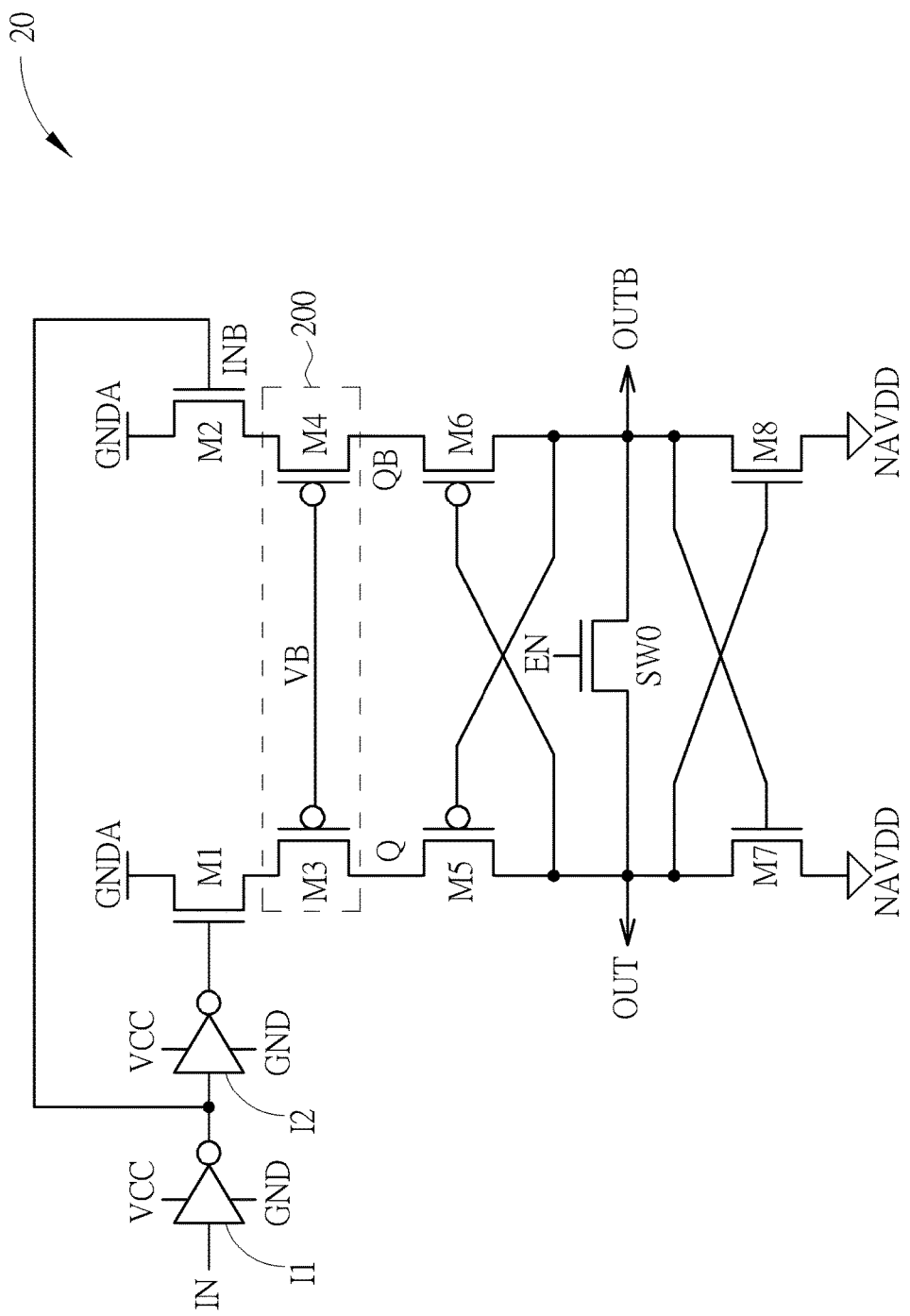
FIG. 4 is a schematic diagram of an exemplary implementation of the negative voltage level shifter shown in FIG. 2.

Please refer to FIG. 4, which is a schematic diagram of an exemplary implementation of the negative voltage level shifter 20. In detail, the clamp circuit 200 includes two clamp transistors M3 and M4, which receive a bias voltage VB. In this embodiment, the clamp transistors M3 and M4 are PMOS transistors. The negative voltage level shifter 20 may further include two switch transistors M5 and M6, which are coupled between the clamp circuit 200 and the pair of output transistors M7 and M8. In this embodiment, the switch transistors M5 and M6 are PMOS transistors.

As for the clamp transistor M3, the drain terminal is coupled to the pair of output transistors M7 and M8 via the switch transistor M5, the source terminal is coupled to the input transistor M1, and the gate terminal is coupled to a bias node for receiving the bias voltage VB. As for the clamp transistor M4, the drain terminal is coupled to the pair of output transistors M7 and M8 via the switch transistor M6, the source terminal is coupled to the input transistor M2, and the gate terminal is coupled to the bias node for receiving the bias voltage VB. As for the switch transistor M5, the drain terminal is coupled to the pair of output transistors M7 and M8, the source terminal is coupled to the clamp circuit 200, and the gate terminal is coupled to the drain terminal of the switch transistor M6. As for the switch transistor M6, the drain terminal is coupled to the pair of output transistors M7 and M8, the source terminal is coupled to the clamp circuit 200, and the gate terminal is coupled to the drain terminal of the switch transistor M5.

As shown in FIG. 4, the switch SW0 is implemented with a single NMOS transistor controlled by an enabling signal EN. Those skilled in the art should understand that the switch SW0 may also be implemented in other manners, such as a PMOS transistor or a transmission gate, which should not be a limitation of the present invention.

In the negative voltage level shifter 20 shown in FIG. 4, the clamp circuit 200 may clamp the source voltages of the pair of input transistors M1 and M2, to let the "low" voltage level of the input signal IN minus the source voltage of the corresponding input transistor M1 or M2 to be smaller than the threshold voltage of this input transistor. The bias voltage VB may turn on one of the clamp transistors M3 and M4 and turn off another one simultaneously when the negative voltage level shifter 20 changes state.

More specifically, the transistors M1 and M3 act as a switch that may be turned on or off to pass current through the left branch or not, and the transistors M2 and M4 act as a switch that may be turned on or off to pass current through the right branch or not. For example, suppose that the gate-to-source voltage of the input transistors M1 and M2 is Vgsn, the gate-to-source voltage of the clamp transistors M3 and M4 is Vgsp, and the threshold voltage of the transistors M1-M4 is Vth. If the summation of the absolute values of the gate-to-source voltages Vgsn and Vgsp is greater than twice the threshold voltage Vth, i.e., Vgsn+|Vgsp|>2Vth, the switch may be turned on; if the summation of the absolute values of the gate-to-source voltages Vgsn and Vgsp is smaller than twice the threshold voltage Vth, i.e., Vgsn+|Vgsp|<2Vth, the switch may be turned off.

As mentioned above, the negative voltage level shifter 20 receives the input signal IN and the inverse input signal INB. In one state, the input signal IN equals 1.5V and the inverse input signal INB equals 0V; while in another state, the input signal IN equals 0V and the inverse input signal INB equals 1.5V. Supposing that the threshold voltage Vth equals 0.6V and the bias voltage is 0V, when the input signal IN received by the input transistor M1 is 1.5V, the summation of the gate-to-source voltage Vgsn of M1 and the absolute value of the gate-to-source voltage |Vgsp| of M3 is obtained as follows:

Vgsn+|Vgsp|=IN−VB=1.5V.

Since the summation is greater than twice the threshold voltage Vth (=1.2V), the transistors M1 and M3 (at the circuit branch receiving the input signal IN) may be turned on to pass current and thus pull the voltage Q up to the ground voltage GNDA.

In another state, when the input signal IN is 0V, the summation of the gate-to-source voltage Vgsn of M1 and the absolute value of the gate-to-source voltage |Vgsp| of M3 is obtained as follows: Vgsn+|Vgsp|=IN−VB=0V.

Since the summation is smaller than twice the threshold voltage Vth (=1.2V), the transistors M1 and M3 (at the circuit branch receiving the input signal IN) may be turned off.

As mentioned above, if the input signal IN equals 1.5V, the inverse input signal INB may equal 0V; if the input signal IN equals 0V, the inverse input signal INB may equal 1.5V. Therefore, when a current flows through the transistors M1 and M3, the transistors M2 and M4 are cut off; when a current flows through the transistors M2 and M4, the transistors M1 and M3 are cut off. Thus, during state transition, the current consumption appears in only one circuit branch, which generates less power consumption.

Figure 5:
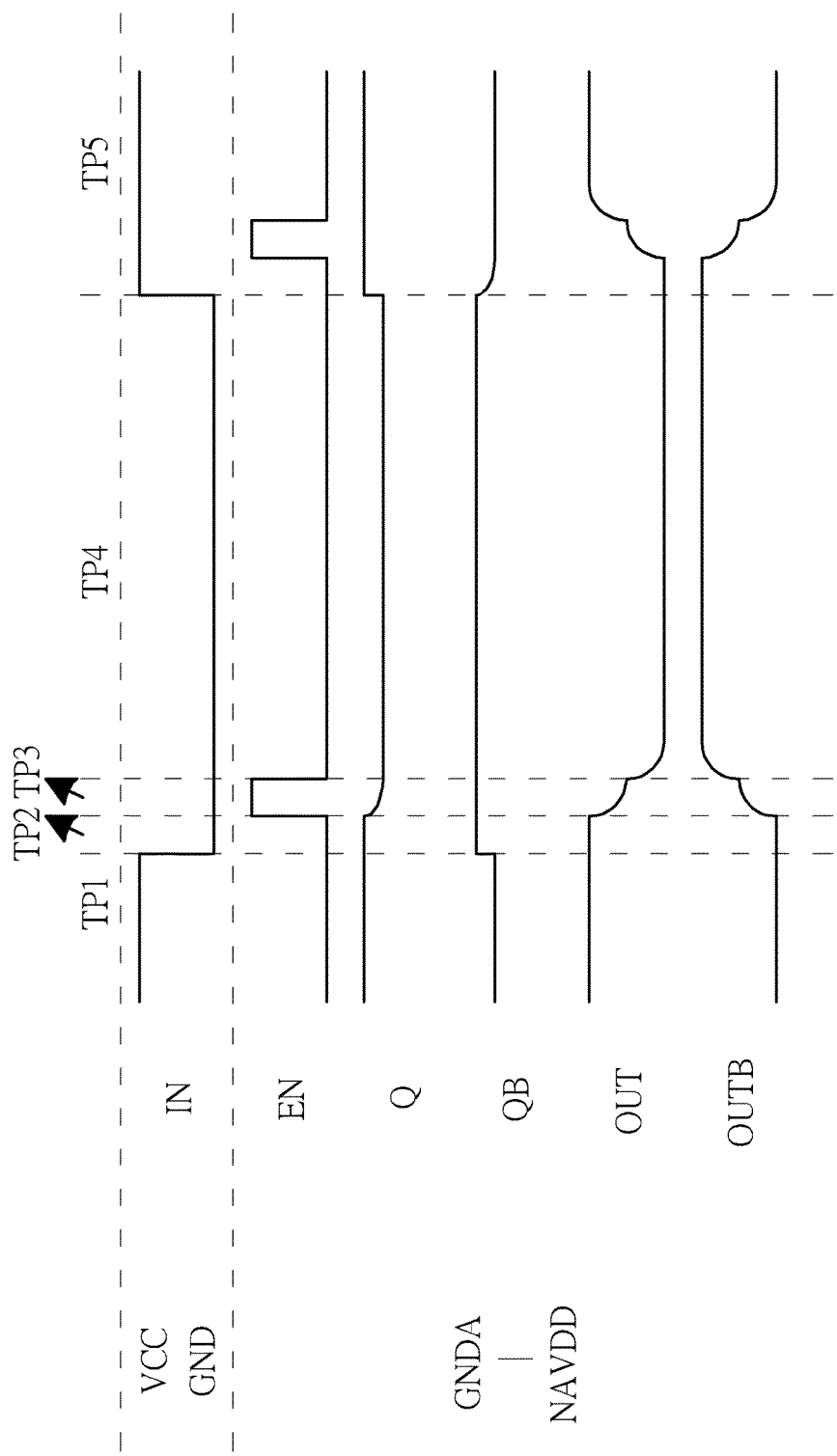
FIG. 5 is a waveform diagram illustrating signals of the negative voltage level shifter shown in FIG. 4.

Please refer to FIG. 5, which is a waveform diagram illustrating signals of the negative voltage level shifter 20. FIG. 5 illustrates waveforms of the input signal IN, the output signal OUT, the inverse output signal OUTB, the enabling signal EN, the drain voltage Q of the clamp transistor M3 and the drain voltage QB of the clamp transistor M4. In detail, the input signal IN is switched in the voltage domain VCC-GND which may be between 1.5V and 0V, and other signals are switched in the negative voltage domain GNDA-NAVDD which may be between 0V and −6V.

As shown in FIG. 5, the signal transitions are illustrated in detail during the time periods TP1-TP4. In the time period TP1, the input signal IN is "high" which equals the core voltage VCC, e.g., 1.5V, while the output signal OUT is "high" which equals the ground voltage GNDA, e.g., 0V, and the inverse output signal OUTB is "low" which equals the negative supply voltage NAVDD, e.g., −6V. The voltage Q is pulled up to "high" which equals the ground voltage GNDA due to the turned-on transistors M1 and M3. The voltage QB may be floating since the transistors M2, M4 and M6 are turned off. The enabling signal EN is "low", which turns off the switch SW0.

In the time period TP2, the negative voltage level shifter 20 changes state and the input signal IN changes to "low" which equals the ground voltage GND, e.g., 0V, which results in that the inverse input signal INB (not illustrated in FIG. 5) changes to "high" which equals the core voltage VCC. The voltage QB is pulled up to "high" since the transistors M2 and M4 are turned on when the inverse input signal INB changes to "high". At this moment, the output signal OUT remains "high" so that the switch transistor M6 remains off; this prevents additional current consumption.

In the time period TP3, the enabling signal EN generates a pulse which triggers the switch SW0 to be turned on, allowing the two output nodes of the negative voltage level shifter 20 to perform charge sharing. In such a situation, the output signals OUT and OUTB tend toward the middle voltage of the voltage domain GNDA-NAVDD, e.g., −3V.

In the time period TP4, the switch SW0 is turned off by the enabling signal EN. Since the output signal OUT has become −3V, the switch transistor M6 is turned on, which pulls the inverse output signal OUTB to be equal to the voltage QB, which is "high" and equals the ground voltage GNDA. In addition, the inverse output signal OUTB at "high" level entirely turns on the output transistor M7 and also turns off the switch transistor M5, allowing the output signal OUT to be pulled to "low" level equal to the negative supply voltage NAVDD. As a result, when the input signal IN changes to "low", the output signal OUT changes to "low" which equals the negative supply voltage NAVDD and the inverse output signal OUTB changes to "high" which equals the ground voltage GNDA; thus the state transition is completed.

In the time period TP5, the state transition is that the input signal IN changes to "high", which results in that the output signal OUT changes to "high" and the inverse output signal OUTB changes to "low". The related operations are inverse conversion of the operations in the time periods TP1-TP4 described above, and may be easily understood by those skilled in the art. Thus, the details are omitted herein for brevity.

As mentioned above, in the negative voltage level shifter 20, when the input signal IN is "low", the transistors M1 and M3 may be turned off since the summation of the absolute values of the gate-to-source voltages (i.e., the voltage difference of the input signal IN and the bias voltage VB) is smaller than twice the threshold voltage Vth. Therefore, during state transition, the circuit branch that receives a "low" input signal may not pass currents; hence, only one of the two circuit branches in the negative voltage level shifter 20 has current consumption.

Figure 6:
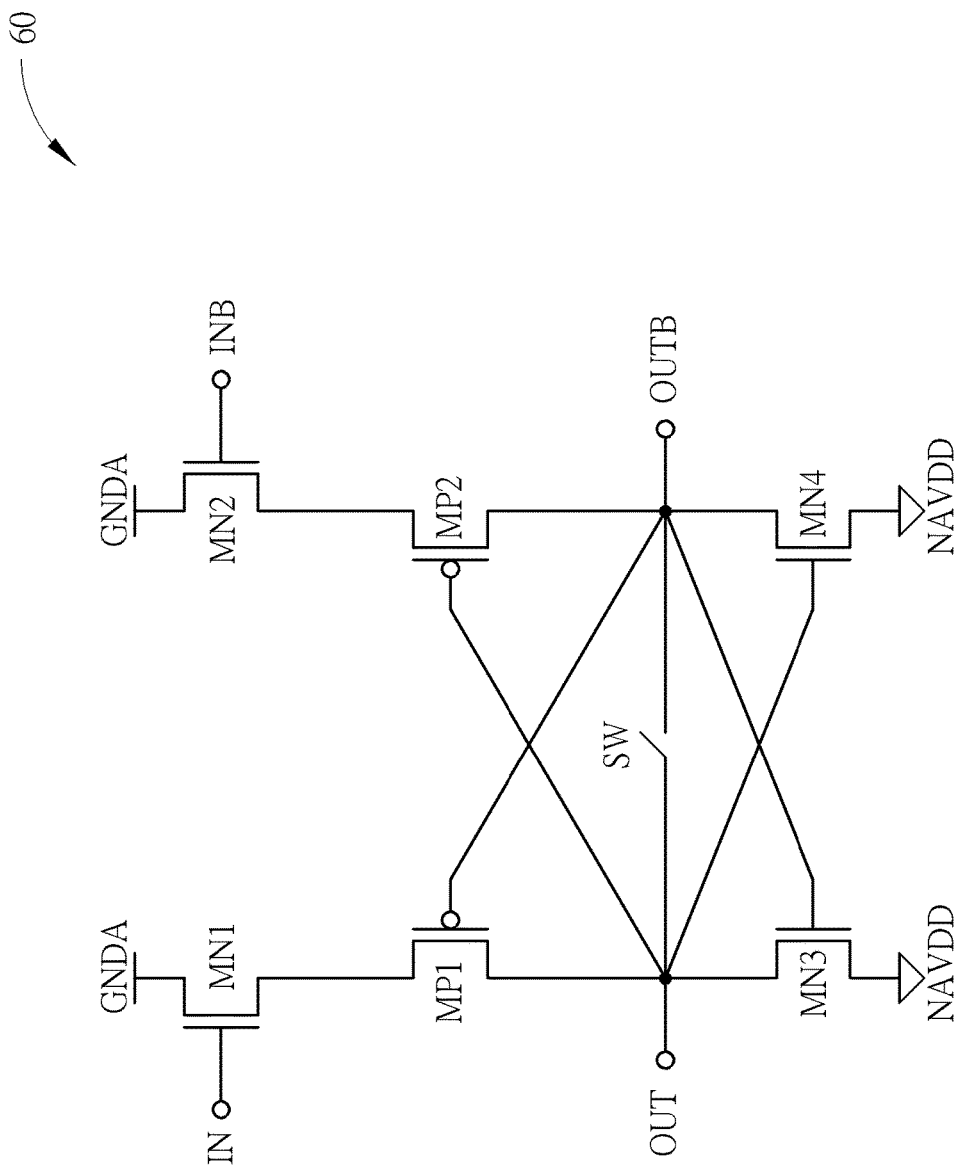
FIG. 6 is a schematic diagram of a negative voltage level shifter without a clamp circuit.

In comparison, in a negative voltage level shifter without any clamp circuit or clamp transistor, the on-off operations are controlled by the output signals OUTB and OUT. For example, please refer to FIG. 6, which is a schematic diagram of a negative voltage level shifter 60 without a clamp circuit. The negative voltage level shifter 60 consists of NMOS transistors MN1-MN4 and PMOS transistors MP1-MP2 and a switch SW. Similarly, the negative voltage level shifter 60 is supplied with a negative supply voltage NAVDD and a ground voltage GNDA, and receives an input signal IN and an inverse input signal INB and correspondingly outputs an output signal OUT and an inverse output signal OUTB in negative voltage domain. When the input signals IN and INB change their states, both of the NMOS transistors MN1 and MN2 are turned on, such that both circuit branches of the negative voltage level shifter 60 pass large currents, which results in extremely large power consumption. In addition, due to the large currents, if the two output terminals have different levels of load magnitudes, signal transition may fail.

In other words, in the negative voltage level shifter 60, when the input signal IN changes state, both circuit branches have current consumption. More specifically, when the input signal IN changes from 1.5V to 0V, both the transistors MN1 and MP1 are turned on since the voltage level of the input signal IN minus the voltage level of the inverse output signal OUTB may be greater than twice the threshold voltage; hence, the left branch passes current. At the same time, the inverse input signal INB changes from 0V to 1.5V, and both the transistors MN2 and MP2 are turned on since the voltage level of the inverse input signal INB minus the voltage level of the output signal OUT may be greater than twice the threshold voltage; hence, the right branch also passes current. Since large currents keep flowing in both circuit branches during state transition, the output signals OUT and OUTB may be pulled by the currents and thus may not successfully achieve their target voltages, especially when the output loading of the negative voltage level shifter 60 is unbalanced.

As can be seen, in the negative voltage level shifter 20 of the present invention, one of the clamp transistors may be turned off as controlled by the bias voltage VB. In such a situation, whether a circuit branch passes currents is determined by the bias voltage VB rather than the output voltage. In comparison, there is no clamp circuit or clamp transistor included in the negative voltage level shifter 60; hence, the source voltages of the transistors MN1 and MN2 cannot be clamped at a higher level, and the switches formed by the input transistors MN1 and MN2 are turned on during state transition and both circuit branches may pass currents.

In addition, in the negative voltage level shifter 20 of the present invention, without additional current consumption, the state transition is completed more easily even if the output loading is unbalanced.

Please note that the present invention aims at providing a negative voltage level shifter having a clamp circuit to generate less power consumption during state transition. Those skilled in the art may make modifications and alternations accordingly. For example, the voltage values of the signals and/or nodes in the negative voltage level shifter mentioned above are only one of various embodiments of the present invention. The circuit structure provided in this disclosure is applicable to any types of level shifters to realize different levels of voltage conversion. The bias voltage VB may be controlled or configured to a value that allows the switches formed by the clamp circuit to be turned on when the corresponding input signal changes to "high" and turned off when the corresponding input signal changes to "low". In an exemplary embodiment where an input signal with 1.5V positive voltage is converted to an output signal with −6V negative voltage, the bias voltage VB may be −1V rather than 0V. This is because the body terminal of the input NMOS transistors may be coupled to the negative voltage −6V, which enlarges the threshold voltage of the input transistors due to the body effect. Thus, the bias voltage VB may be configured to have a lower value such as −1V, allowing the voltage difference between the 1.5V input signal and the bias voltage VB to be larger, in order to turn on the input transistor having a larger threshold voltage when the body effect exists.

Figure 7:
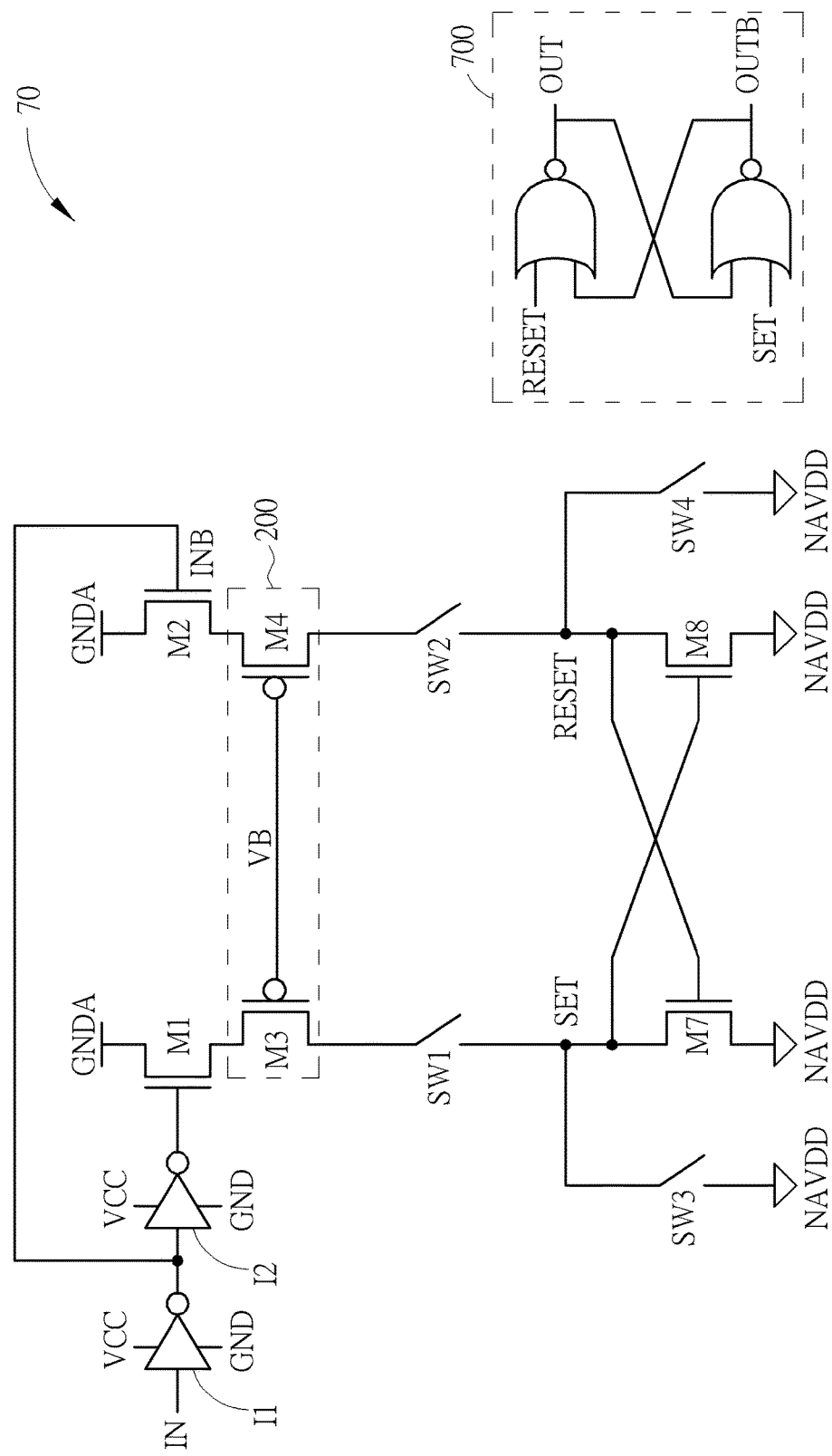
FIG. 7 is a schematic diagram of another negative voltage level shifter according to an embodiment of the present invention.

In addition, the circuit structures of the negative voltage level shifter are not limited in those shown in FIG. 2 and/or FIG. 4. Please refer to FIG. 7, which is a schematic diagram of another negative voltage level shifter 70 according to an embodiment of the present invention. The circuit structure of the negative voltage level shifter 70 is similar to the circuit structure of the negative voltage level shifter 20, so the signals and elements having similar functions are denoted by the same symbols. The difference between the negative voltage level shifter 70 and the negative voltage level shifter 20 is that, the negative voltage level shifter 70 further includes switches SW1-SW4 and a SR latch 700. The negative voltage level shifter 70 includes a set node and a reset node coupled between the circuit branches of the negative voltage level shifter 70 and the SR latch 700. The circuit branches receive the input signal IN and the inverse input signal INB, and output a set signal SET and a reset signal RESET to the SR latch 700 via the set node and the reset node, respectively. The SR latch 700, coupled to the set node and the reset node, receives the set signal SET and the reset signal RESET and correspondingly generates the output signal OUT and the inverse output signal OUTB.

In detail, the switches SW1-SW4 perform operations similar to the switch SW0 and the switch transistors M5 and M6 in the negative voltage level shifter 20. The switch SW1 is coupled between the set node and the clamp transistor M3. The switch SW2 is coupled between the reset node and the claim transistor M4. The switch SW3 is coupled between the set node and a negative power supply terminal of the negative voltage level shifter 70. The switch SW4 is coupled between the reset node and the negative power supply terminal of the negative voltage level shifter 70. Those skilled in the art may understand that the switches SW1-SW4 may be implemented in any manners such as NMOS transistors, PMOS transistors or transmission gates, which should not be a limitation of the present invention.

Figure 8:
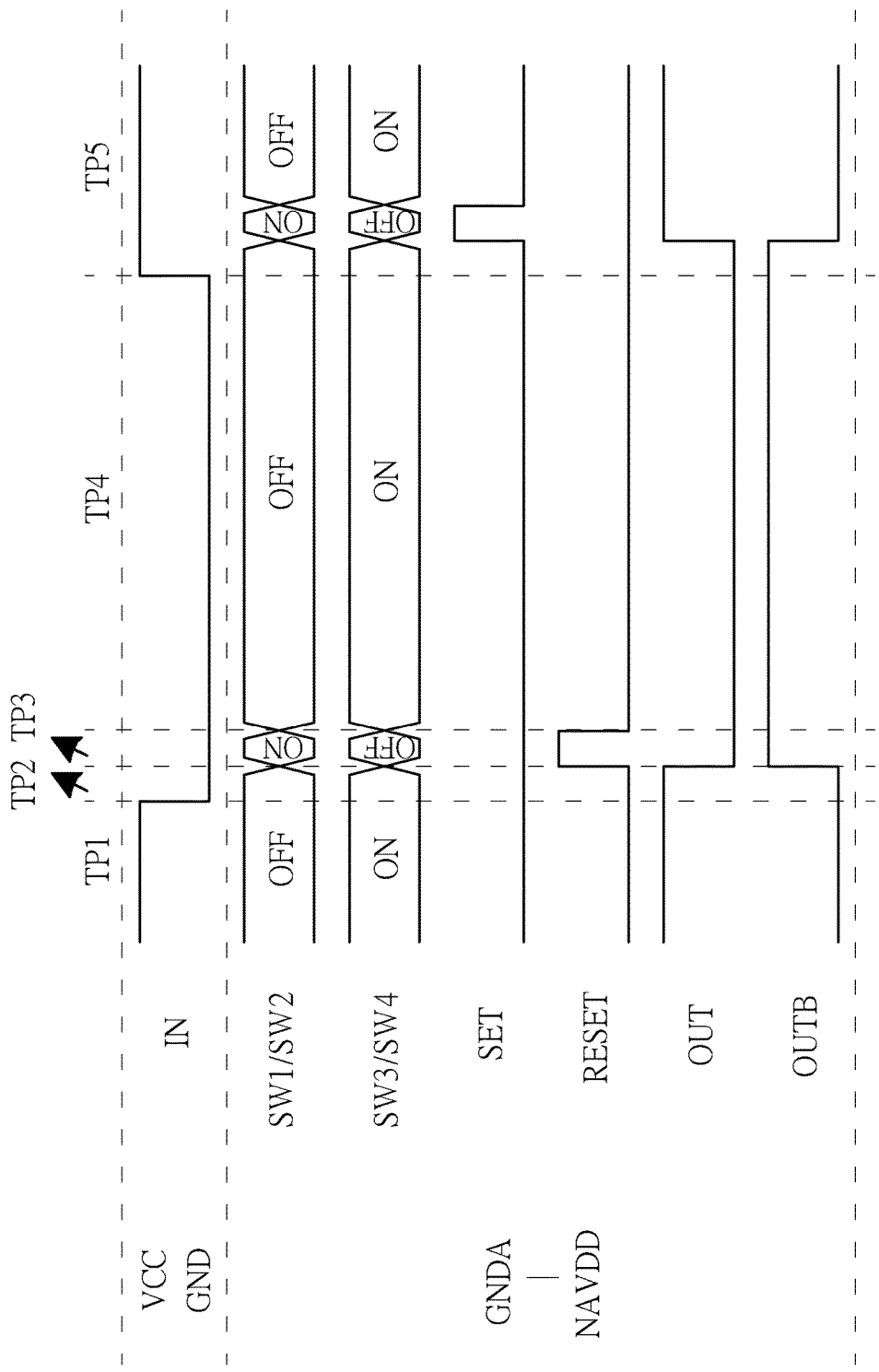
FIG. 8 is a waveform diagram illustrating signals of the negative voltage level shifter shown in FIG. 7.

Please refer to FIG. 8, which is a waveform diagram illustrating signals of the negative voltage level shifter 70. FIG. 8 illustrates waveforms of the input signal IN, the output signal OUT, the inverse output signal OUTB, the set signal SET and the reset signal RESET. The operations of the switches SW1-SW4 are also illustrated in FIG. 8.

As shown in FIG. 8, the signal transitions are illustrated in detail during the time periods TP1-TP4. In the time period TP1, the input signal IN is "high" which equals the core voltage VCC, e.g., 1.5V, while the output signal OUT is "high" which equals the ground voltage GNDA, e.g., 0V, and the inverse output signal OUTB is "low" which equals the negative supply voltage NAVDD, e.g., −6V. The switches SW1 and SW2 are turned off and the switches SW3 and SW4 are turned on. Thus, the set signal SET and the reset signal RESET are pulled to "low" by the switches SW3 and SW4 before signal transition starts.

In the time period TP2, the negative voltage level shifter 70 changes state and the input signal IN changes to "low" which equals the ground voltage GND, e.g., 0V, which results in that the inverse input signal INB (not illustrated in FIG. 8) changes to "high" which equals the core voltage VCC. The transistors M2 and M4 are turned on as similar to the operations of the negative voltage level shifter 20 shown in FIG. 4. The signals SET, RESET, OUT and OUTB and the states of the switches SW1-SW4 remain unchanged in this time period TP2.

In the time period TP3, the switches SW1 and SW2 are turned on and the switches SW3 and SW4 are turned off. Since the transistors M2 and M4 and the switch SW2 are turned on, the reset signal RESET is pulled up to "high". The set signal SET remains "low" since the transistors M1 and M3 are turned off. With the pulse in the reset signal RESET, the output signal is pulled to "low" and the inverse output signal is pulled to "high" by the SR latch 700.

In the time period TP4, the switches SW1 and SW2 are turned off and the switches SW3 and SW4 are turned on, which pull the reset signal RESET to "low". The output signal OUT and the inverse output signal OUTB remain. As a result, when the input signal IN changes to "low", the output signal OUT changes to "low" which equals the negative supply voltage NAVDD and the inverse output signal OUTB changes to "high" which equals the ground voltage GNDA; thus the state transition is completed.

In the time period TP5, the state transition is that the input signal IN changes to "high", which results in that the output signal OUT changes to "high" and the inverse output signal OUTB changes to "low". The related operations are inverse conversion of the operations in the time periods TP1-TP4 described above, and may be easily understood by those skilled in the art. Thus, the details are omitted herein for brevity.

Figure 9:
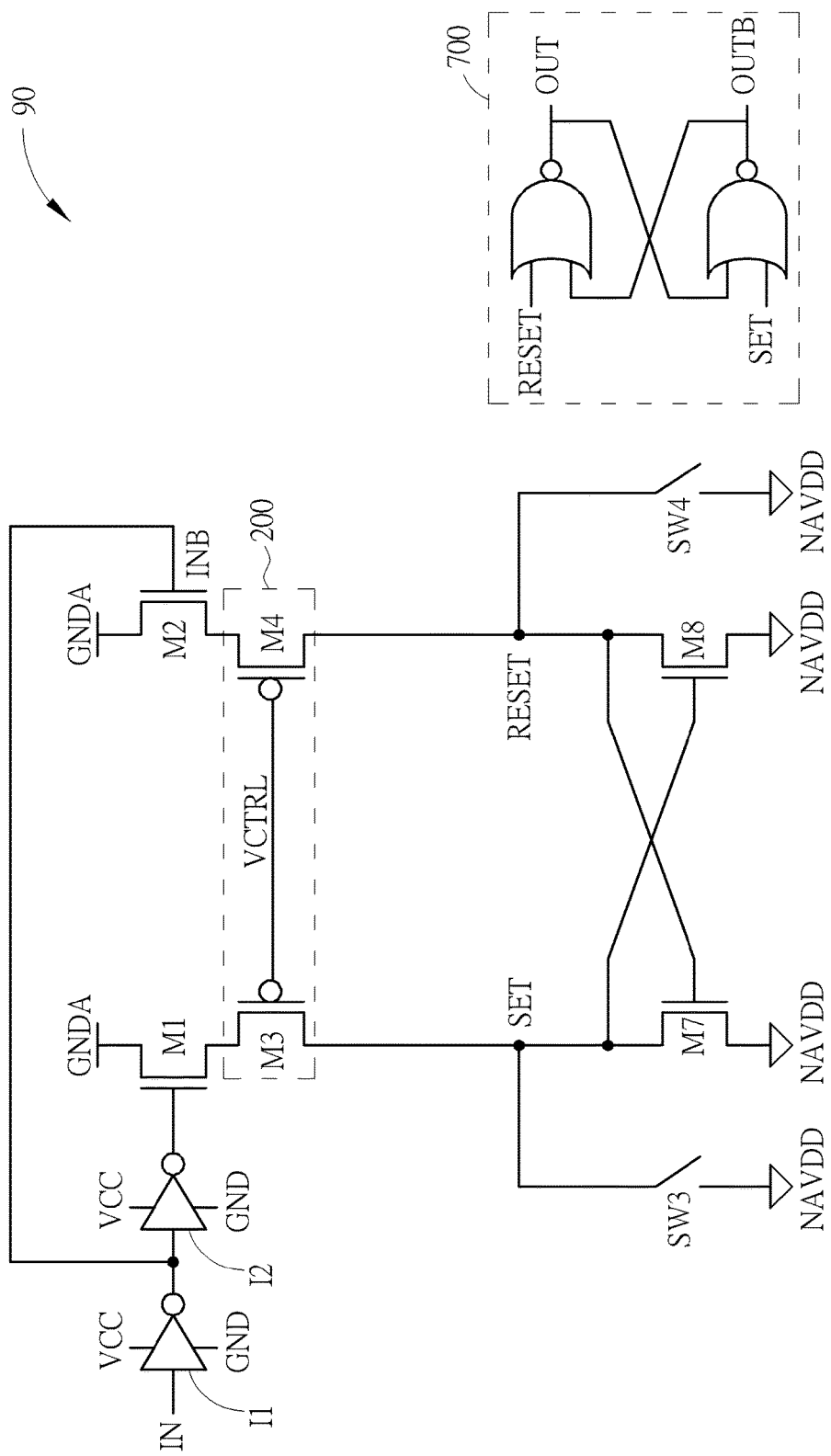
FIG. 9 is a schematic diagram of a further negative voltage level shifter according to an embodiment of the present invention.

Please refer to FIG. 9, which is a schematic diagram of a further negative voltage level shifter 90 according to an embodiment of the present invention. The circuit structure of the negative voltage level shifter 90 is similar to the circuit structure of the negative voltage level shifter 70, so the signals and elements having similar functions are denoted by the same symbols. The difference between the negative voltage level shifter 90 and the negative voltage level shifter 70 is that, the negative voltage level shifter 90 does not include the switches SW1 and SW2; instead, the clamp transistors M3 and M4 receive a control signal VCTRL for controlling the operations of the clamp circuit, where the control signal VCTRL is switched between the bias voltage VB as mentioned above and another voltage level such as the ground voltage GND.

Figure 10:
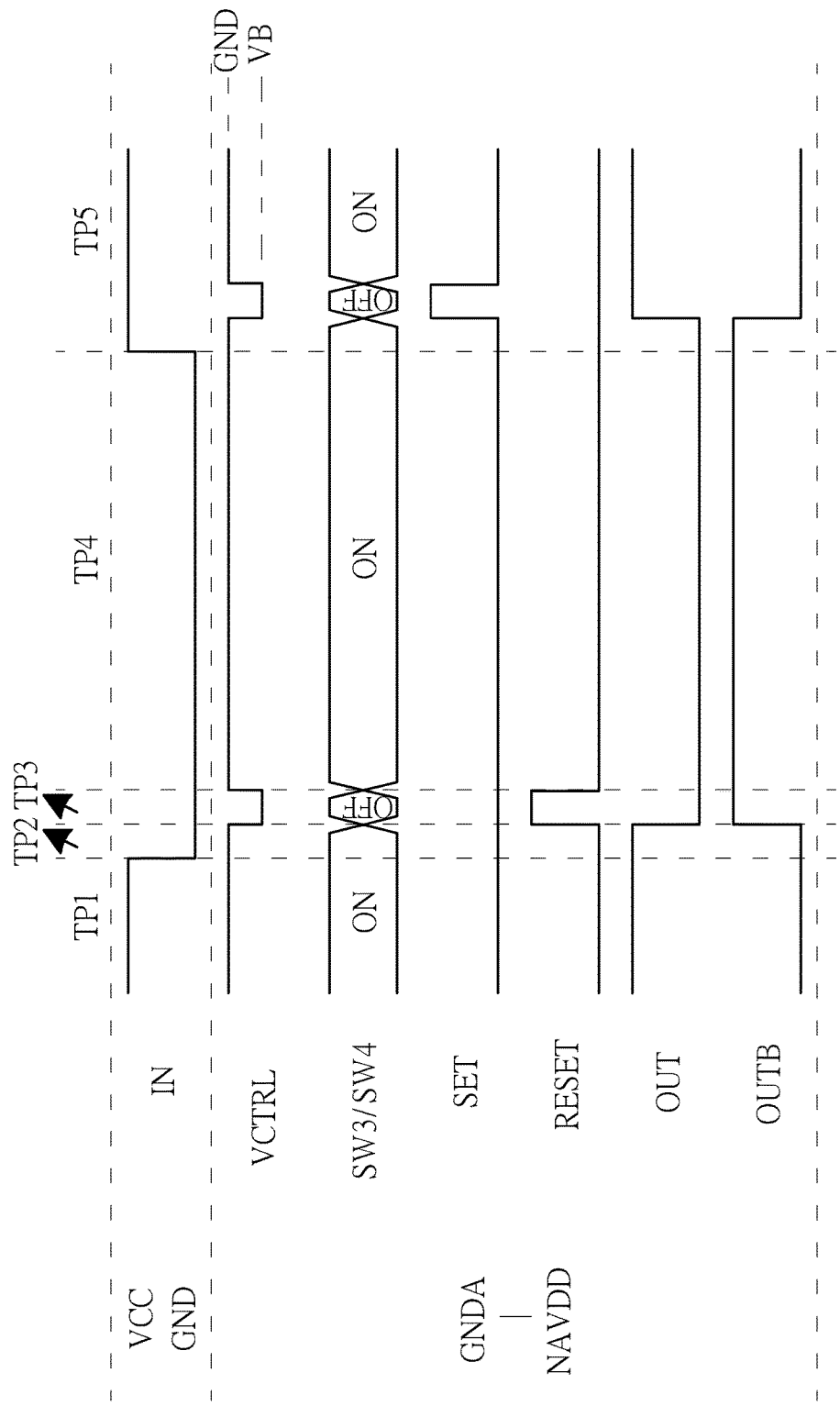
FIG. 10 is a waveform diagram illustrating signals of the negative voltage level shifter shown in FIG. 9.

More specifically, the operations of the negative voltage level shifter 90 are different from the operations of the negative voltage level shifter 70 in the time period TP3. The detailed operations and related waveforms are illustrated in FIG. 10 and will be described hereinafter.

In the time periods TP1, TP2 and TP4, the control signal VCTRL is at the ground voltage GND. The ground voltage GND turns off the clamp transistors M3 and M4 simultaneously when the negative voltage level shifter 90 changes state, so that the two circuit branches of the negative voltage level shifter 90 may not pass currents, and thus no additional current consumption exists. In the time period TP3, the control signal VCTRL is switched to the bias voltage VB, which allows one of the clamp transistors M3 and M4 to be turned on when its corresponding input signal is "high" and allows another one to be turned off. The operations of other circuit elements and signals are similar to those shown in FIGS. 5 and 7, and thus omitted herein for brevity. In this embodiment, the ground voltage GND may be 0V and the bias voltage VB may be −1V.

As can be seen, the control signal VCTRL allows the clamp transistors M3 and M4 to realize functions of both the switches and the clamp circuit. In the time periods TP1, TP2 and TP4, the control signal VCTRL is at the ground voltage GND, and thus the clamp transistors M3 and M4 are operated as turned-off switches as similar to the switches SW1 and SW2 in the negative voltage level shifter 70. In the time period TP3, the control signal VCTRL is at the bias voltage VB, which realizes the clamping operations of the present invention. In this embodiment, current consumption is minimized since it is generated only in the time period TP3 and in one circuit branch.

Please note that the above implementations of the control signal VCTRL is one of various implementations of the present invention. For example, in the time periods TP1, TP2 and TP4, the control signal VCTRL may be at another bias voltage VB' other than the ground voltage GND and different from the bias voltage VB, as long as the level of the bias voltage VB' is high enough to simultaneously turn off the clamp transistors M3 and M4. Similarly, in the time period TP3, the control signal VCTRL is at the bias voltage VB that may turn on one of the clamp transistors M3 and M4 while turn off the other one.

To sum up, the present invention provides a negative voltage level shifter for converting a positive voltage domain to a negative voltage domain. The negative voltage level shifter includes a clamp circuit, which clamps the source voltages of the input transistors, to prevent one of the circuit branches of the negative voltage level shifter to pass current during state transition. As a result, the negative voltage level shifter of the present invention is able to achieve less power consumption by reducing currents during state transition.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A negative voltage level shifter, comprising:
    a pair of input transistors;
    a pair of output transistors;
    a clamp circuit, coupled between the pair of input transistors and the pair of output transistors, for clamping source voltages of the pair of input transistors;
    a first switch transistor, coupled between the clamp circuit and the pair of output transistors, the first switch transistor comprising:
        a drain terminal, coupled to the pair of output transistors;
        a source terminal, coupled to the clamp circuit; and
        a gate terminal; and
    a second switch transistor, coupled between the clamp circuit and the pair of output transistors, the second switch transistor comprising:
        a drain terminal, coupled to the pair of output transistors;
        a source terminal, coupled to the clamp circuit; and
        a gate terminal;
    wherein the gate terminal of the first switch transistor is coupled to the drain terminal of the second switch transistor, and the gate terminal of the second switch transistor is coupled to the drain terminal of the first switch transistor.

2. The negative voltage level shifter of claim 1, wherein the pair of input transistors comprise:
    a first input transistor, comprising:
        a drain terminal, coupled to a ground terminal;
        a source terminal, coupled to the clamp circuit; and
        a gate terminal, coupled to an input terminal of the negative voltage level shifter, for receiving an input signal; and
    a second input transistor, comprising:
        a drain terminal, coupled to the ground terminal;
        a source terminal, coupled to the clamp circuit; and
        a gate terminal, coupled to the input terminal of the negative voltage level shifter, for receiving an inverse input signal.

3. The negative voltage level shifter of claim 1, wherein the pair of output transistors comprise:
    a first output transistor, comprising:
        a drain terminal, coupled to the clamp circuit;
        a source terminal, coupled to a negative power supply terminal of the negative voltage level shifter; and
        a gate terminal; and
    a second output transistor, comprising:
        a drain terminal, coupled to the clamp circuit;
        a source terminal, coupled to the negative power supply terminal of the negative voltage level shifter; and
        a gate terminal;
    wherein the gate terminal of the first output transistor is coupled to the drain terminal of the second output transistor, and the gate terminal of the second output transistor is coupled to the drain terminal of the first output transistor.

4. The negative voltage level shifter of claim 3, further comprising:
    a switch, coupled between an output terminal of the negative voltage level shifter and an inverse output terminal of the negative voltage level shifter.

5. The negative voltage level shifter of claim 1, wherein the clamp circuit comprises a first clamp transistor and a second clamp transistor, the first clamp transistor comprises:
    a drain terminal, coupled to the pair of output transistors;
    a source terminal, coupled to a first input transistor among the pair of input transistors; and
    a gate terminal, for receiving a first bias voltage; and
    the second clamp transistor comprises:
        a drain terminal, coupled to the pair of output transistors;
        a source terminal, coupled to a second input transistor among the pair of input transistors; and
        a gate terminal, for receiving the first bias voltage.

6. The negative voltage level shifter of claim 5, wherein the first clamp transistor and the second clamp transistor receive a control signal, which is switched between the first bias voltage and a second bias voltage.

7. The negative voltage level shifter of claim 6, wherein the second bias voltage turns off the first clamp transistor and the second clamp transistor simultaneously when the negative voltage level shifter changes state.

8. The negative voltage level shifter of claim 1, wherein the pair of output transistors are coupled to a set node and a reset node, and the negative voltage level shifter further comprises:
    a first switch, coupled between the set node and the clamp circuit;
    a second switch, coupled between the reset node and the clamp circuit;
    a third switch, coupled between the set node and a negative power supply terminal of the negative voltage level shifter;
    a fourth switch, coupled between the reset node and the negative power supply terminal of the negative voltage level shifter; and
    a SR latch, coupled to the set node and the reset node, for generating an output signal and an inverse output signal of the negative voltage level shifter by receiving a set signal from the set node and a reset signal from the reset node.

9. The negative voltage level shifter of claim 1, wherein the pair of output transistors are coupled to a set node and a reset node, and the negative voltage level shifter further comprises:
- a first switch, coupled between the set node and a negative power supply terminal of the negative voltage level shifter;
- a second switch, coupled between the reset node and the negative power supply terminal of the negative voltage level shifter; and
- a SR latch, coupled to the set node and the reset node, for generating an output signal and an inverse output signal of the negative voltage level shifter by receiving a set signal from the set node and a reset signal from the reset node.

* * * * *